United States Patent
Xie et al.

(10) Patent No.: US 10,636,986 B2
(45) Date of Patent: Apr. 28, 2020

(54) FLEXIBLE SUBSTRATE, MANUFACTURING METHOD OF THE SAME, FLEXIBLE DISPLAY SUBSTRATE AND MANUFACTURING METHOD OF THE SAME

(71) Applicant: BOE TECHNOLOGY GROUP CO., LTD., Beijing (CN)

(72) Inventors: Chunyan Xie, Beijing (CN); Song Zhang, Beijing (CN); Mingche Hsieh, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/988,700

(22) Filed: May 24, 2018

(65) Prior Publication Data

US 2019/0131552 A1  May 2, 2019

(30) Foreign Application Priority Data

Oct. 27, 2017  (CN) .......................... 2017 1 1021745

(51) Int. Cl.
*H01L 51/00* (2006.01)
*H01L 27/32* (2006.01)
(Continued)

(52) U.S. Cl.
CPC ........ *H01L 51/0097* (2013.01); *G03F 7/0007* (2013.01); *H01L 27/3244* (2013.01); *H01L 51/003* (2013.01); *H01L 51/5253* (2013.01); *H01L 51/56* (2013.01); *H01L 2227/326* (2013.01); *H01L 2251/5338* (2013.01)

(58) Field of Classification Search
None
See application file for complete search history.

(56) References Cited

U.S. PATENT DOCUMENTS

| | | | |
|---|---|---|---|
| 2004/0080276 A1* | 4/2004 | Ito | H01L 27/3279 315/169.1 |
| 2011/0234477 A1* | 9/2011 | Sano | H01L 51/0097 345/77 |

(Continued)

FOREIGN PATENT DOCUMENTS

| | | |
|---|---|---|
| CN | 102201547 A | 9/2011 |
| CN | 105024018 A | 11/2015 |

(Continued)

OTHER PUBLICATIONS

First Office Action for Chinese Application No. 201711021745.6, dated Aug. 13, 2019, 8 pages.

*Primary Examiner* — Nilufa Rahim
(74) *Attorney, Agent, or Firm* — Brooks Kushman P.C.

(57) ABSTRACT

A flexible substrate, a manufacturing method thereof, a flexible display substrate and a manufacturing method thereof are provided. The flexible substrate includes a first organic thin film, an inorganic thin film on the first organic thin film, a barrier structure on the inorganic thin film and at an inner side of a periphery of the inorganic thin film, and a second organic thin film in a region defined by the barrier structure, wherein an orthographic projection of the second organic thin film onto the first organic thin film is located at an inner side of the periphery of the first organic thin film.

19 Claims, 3 Drawing Sheets

(51) Int. Cl.
*H01L 51/52* (2006.01)
*H01L 51/56* (2006.01)
*G03F 7/00* (2006.01)

(56) References Cited

U.S. PATENT DOCUMENTS

| | | |
|---|---|---|
| 2014/0323006 A1 | 10/2014 | Song et al. |
| 2017/0162825 A1 | 6/2017 | Xiao et al. |
| 2018/0040848 A1* | 2/2018 | Hirase .................... H05B 33/04 |
| 2018/0198094 A1 | 7/2018 | Yu |

FOREIGN PATENT DOCUMENTS

| | | |
|---|---|---|
| CN | 105552247 A | 5/2016 |
| CN | 106711355 A | 5/2017 |

\* cited by examiner

FLEXIBLE SUBSTRATE, MANUFACTURING METHOD OF THE SAME, FLEXIBLE DISPLAY SUBSTRATE AND MANUFACTURING METHOD OF THE SAME

CROSS-REFERENCE TO RELATED APPLICATION

This application claims priority to Chinese Patent Application No. 201711021745.6 filed on Oct. 27, 2017, which is incorporated herein by reference in its entirety.

TECHNICAL FIELD

The present disclosure relates to a field of display technology, and in particular to a flexible substrate, a manufacturing method of the flexible substrate, a flexible display substrate and a manufacturing method of the flexible display substrate.

BACKGROUND

A relevant method for manufacturing a flexible substrate generally includes steps of providing a base substrate, forming an organic thin film on the base substrate to form a flexible substrate, forming a display component on the flexible substrate, separating the organic thin film and the display component from the base substrate, and attaching a protection film onto a surface of the organic thin film away from the display component, thereafter completing a manufacturing process of the flexible display substrate.

In a process of manufacturing the flexible display substrate, in order to improve reliability and process stability of the flexible display substrate, two organic thin films may generally be formed on the base substrate, i.e., a multilayer structure formed of a first organic thin film, an inorganic thin film and a second organic thin film may be formed on the base substrate. However, the second organic thin film is made of a liquid material which may flow near a periphery of the inorganic thin film, and as a result, a periphery of the second organic thin film may extend beyond a periphery of the first organic thin film. In such a case, when separating the first organic thin film, the inorganic thin film, the second organic thin film and the display component from the base substrate through a Laser-Lift-Off (LLO) technique, it is difficult to separate the second organic thin film from the base substrate near the peripheral of the second organic thin film, and a yield of a subsequent product may be adversely affected.

SUMMARY

The present disclosure provides a flexible substrate, a manufacturing method of the flexible substrate, a flexible display substrate and a manufacturing method of the flexible display substrate In a first aspect, the present disclosure provides a flexible substrate, the flexible substrate includes a first organic thin film, an inorganic thin film on the first organic thin film, a barrier structure on the inorganic thin film and at an inner side of a periphery of the inorganic thin film, and a second organic thin film in a region defined by the barrier structure, wherein an orthographic projection of the second organic thin film onto the first organic thin film is at an inner side of a periphery of the first organic thin film.

Optionally, an orthographic projection of the barrier structure onto the first organic thin film is located at the inner side of the periphery of the first organic thin film.

Optionally, the orthographic projection of the barrier structure onto the first organic thin film is located on the periphery of the first organic thin film or at an outer side of the periphery of the first organic thin film.

Optionally, the barrier structure is made of organic photosensitive resin.

Optionally, the barrier structure has a thickness larger than or equal to a thickness of a peripheral of the second organic thin film.

Optionally, the thickness of the barrier structure is in a range of 1 μm to 3 μm.

Optionally, each of the first organic thin film and the second organic thin film is a flexible thin film.

Optionally, the first organic thin film is located at the inner side of the periphery of the inorganic thin film.

In a second aspect, the present disclosure provides a flexible display substrate, and the flexible display substrate includes the flexible substrate according to the first aspect, and a display component on the flexible substrate.

Optionally, the display component includes a thin film transistor (TFT) array layer, a light-emitting element and a thin film encapsulation layer, wherein the thin film transistor (TFT) array layer, the light-emitting element and the thin film encapsulation layer are on the second organic thin film.

In a third aspect, the present disclosure provides a method for manufacturing a flexible substrate, including: providing a base substrate; forming a first organic thin film on the base substrate; forming an inorganic thin film on the first organic thin film; forming a barrier structure on the inorganic thin film and at an inner side of a periphery of the inorganic thin film; and forming a second organic thin film in a region defined by the barrier structure, wherein an orthographic projection of the second organic thin film onto the first organic thin film is located at an inner side of a periphery of the first organic thin film.

Optionally, the forming the barrier structure on the inorganic thin film and at the inner side of the periphery of the inorganic thin film includes: forming a barrier thin film on the inorganic thin film using an organic material; and patterning the barrier thin film to form the barrier structure located at the inner side of the periphery of the inorganic thin film, wherein an orthographic projection of the barrier structure onto the first organic thin film is located at an inner side of a periphery of the first organic thin film.

Optionally, the forming the second organic thin film in the region defined by the barrier structure includes: in the region defined by the barrier structure, forming the second organic thin film having a thickness at the periphery of the second organic thin film smaller than or equal to a thickness of the barrier structure.

Optionally, the forming the barrier structure on the inorganic thin film and at the inner side of the periphery of the inorganic thin film includes: forming a barrier thin film on the inorganic thin film using an organic material; and patterning the barrier thin film to form the barrier structure located at the inner side of the periphery of the inorganic thin film, wherein an orthographic projection of the barrier structure onto the first organic thin film is located on the periphery of the first organic thin film or at an outer side of the periphery of the first organic thin film.

Optionally, the first organic thin film is located at the inner side of the periphery of the inorganic thin film.

In a fourth aspect, the present disclosure provides a method for manufacturing a flexible display substrate, including: forming a flexible substrate using the method according to the third aspect; forming a display component on the flexible substrate, the display component including a thin film transistor (TFT) array layer, a light-emitting element and a thin film encapsulation layer; separating the base substrate from the first organic thin film using a laser lift-off technique; and attaching a protection film onto a surface of the first organic thin film away from the inorganic thin film.

BRIEF DESCRIPTION OF THE DRAWINGS

The following drawings are provided to enhance understanding of the present disclosure, and constitute a part of the present disclosure. The drawings and embodiments of the present disclosure are used for illustrative purposes only, but do not function to limit the scope of the present disclosure. In the drawings.

DETAILED DESCRIPTION

A flexible substrate, a manufacturing method of the flexible substrate, a flexible display substrate, and a manufacturing method of the flexible display substrate provided by the present disclosure will be described hereinafter in conjunction with the drawings.

Figure 1:
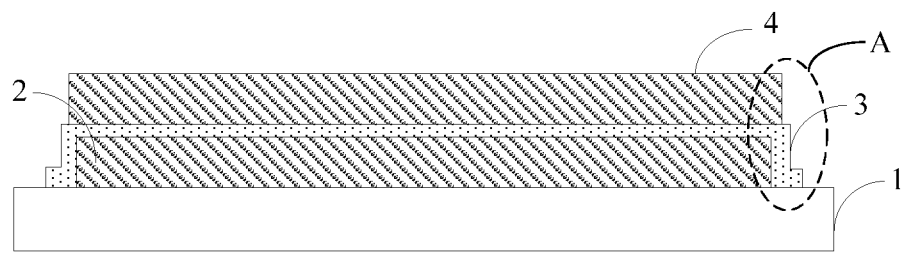
FIG. 1 is a structural schematic diagram of a relevant flexible substrate.
Figure 2:
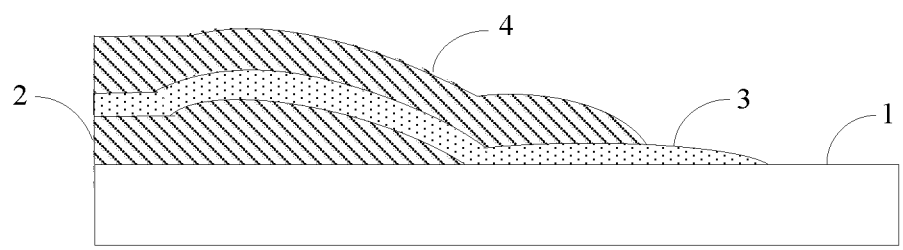
FIG. 2 is an enlarged view of a portion A in FIG. 1.

In a process of manufacturing a flexible substrate in the related art, a first organic thin film 2, an inorganic thin film 3 and a second organic thin film 4 are generally sequentially formed on a base substrate 1, as shown in FIG. 1. The second organic thin film 4 is made of a liquid material. When forming the second organic thin film 4, the liquid material may flow near a periphery of the inorganic thin film 3, and a resultant periphery of the second organic thin film 4 may extend beyond the periphery of the first organic thin film 2 and thereby cover a portion of the inorganic thin film 3 beyond the periphery of the first organic thin film 2, as shown in FIG. 2. For the flexible substrate having such a structure, in a case that the first organic thin film 2, the inorganic thin film 3, the second organic thin film 4 and display components having been formed are to be separated from the base substrate 1 through a Laser-Lift-Off (LLO) technique, since the inorganic thin film 3 exists between the periphery of the second organic thin film 4 and the base substrate 1, the portion of the inorganic thin film 3 beyond the periphery of the first organic thin film 2 may absorb a part of laser energy when using a laser to illuminate the base substrate 1, and thus the first organic thin film 2 may be separated from the base substrate 1, whereas the second organic thin film 2 is difficult to be separated from the base substrate 1, i.e. a separation problem arises.

For a purpose of solving the separation problem, a high-energy laser is generally used to illuminate the base substrate 1, or a low-energy laser is used to illuminate the base substrate 1 repeatedly until a separation between the thin films and the base substrate 1 is completed. However, this solution makes the separation complicated, and a yield of a product may be adversely affected.

In order to solve the above separation problem in a better way, it is found by the inventor of the present disclosure that, the above separation problem in which the second organic thin film 4 is difficult to be separated from the base substrate 1 and the yield of the produce is adversely affected may be solved by controlling a region in which the second organic thin film 4 is formed, so as to prevent the periphery of the second organic thin film 4 from extending beyond the periphery of the first organic thin film 2.

Figure 3:
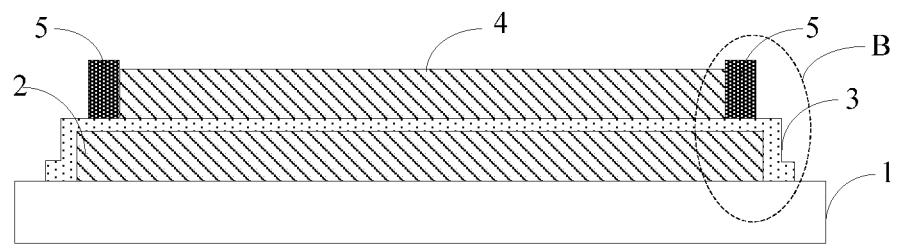
FIG. 3 is a structural schematic view of a flexible substrate provided in the present disclosure.
Figure 4:
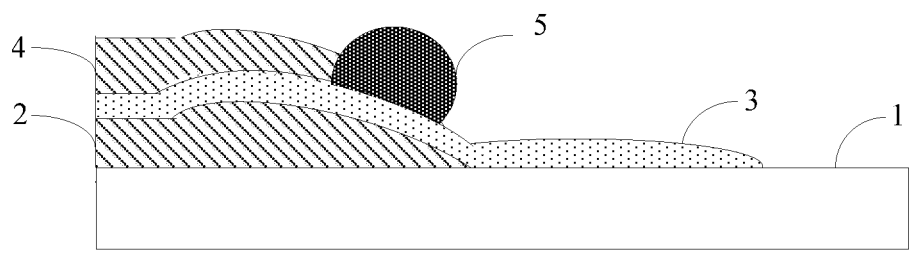
FIG. 4 is an enlarged view of portion B in FIG. 3.

The present disclosure provides in some embodiments a flexible substrate. As shown in FIGS. 3 and 4, the flexible substrate includes a first organic thin film 2, an inorganic thin film 3 arranged on the first organic thin film 2, a barrier structure 5 arranged on the inorganic thin film 3 and at an inner side of a periphery of the inorganic thin film 3, and a second organic thin film 4 arranged in a region defined by the barrier structure 5, wherein an orthographic projection of the second organic thin film 4 onto the first organic thin film 2 is located at an inner side of a periphery of the first organic thin film 2.

In some embodiments of the present disclosure, the first organic thin film 2 is located at an inner side of the periphery of the inorganic thin film 3, i.e., a coverage region of the first organic thin film is located within a coverage region of the inorganic thin film 3.

A manufacturing process of the flexible substrate may include the following steps: providing the based substrate 1; forming the first organic thin film 2 on the base substrate 1; forming the inorganic thin film 3 for blocking moisture and oxygen on the first organic thin film 2; forming the barrier structure 5 on the inorganic thin film 3 and at the inner side of the periphery of the inorganic thin film 3, so that the barrier structure 5 may define a region on the inorganic thin film 3; forming the second organic thin film 4 in the region defined by the barrier structure 5 in such a manner that the orthographic projection of the second organic thin film 4 onto the first organic thin film 2 is located at an inner side of the periphery of the first organic thin film 2. It should be appreciated that each of the first organic thin film 2 and the second organic thin film 4 may be a flexible thin film.

According to the above-mentioned structure and a manufacturing process of the flexible substrate, the barrier structure 5 is arranged on the inorganic thin film 3 and at the inner side of the periphery of the inorganic thin film 3 in the flexible substrate provided in the present disclosure. The barrier structure 5 may define the region on the inorganic thin film 3 and the second organic thin film 4 formed in the region does not extend beyond the periphery of the first organic thin film 2, i.e., the orthographic projection of the second organic thin film 4 onto the first organic thin film 2 is located at the inner side of the periphery of the first organic thin film 2. In this way, in a process of separating the first organic thin film 2 from the base substrate 1 using the LLO technique, only a region in which the first organic thin film 2 is located is needed to be scanned with a laser beam to separate the first organic thin film 2 from the base substrate 1, and the second organic thin film 4 may automatically be separated from the base substrate 1 while separating the first organic thin film 2 from the base substrate 1. Thereby, the above separation problem is solved, and the yield of the product and a stability of the process are ensured.

Optionally, in order to ensure success of a separation process, the orthographic projection of the barrier structure 5 onto the first organic thin film 2 is located at an inner side of the periphery of the first organic thin film 2. In this way, the barrier structure 5 may not extend beyond the periphery of the first organic thin film 2, and an adverse influence to the separation process by the barrier structure 5 is avoided.

In addition, a thickness of the barrier structure 5 may be set in accordance with practical needs, as long as the barrier structure 5 may restrict the periphery of the second organic thin film 4 from extending beyond the coverage region of the first organic thin film 2. For example, the barrier structure 5 may have a thickness within a range of 1 μm (micrometre) to 3 μm. Setting the thickness of the barrier structure 5 to be within the range of 1 μm to 3 μm may cause the thickness of barrier structure 5 to be greater than or equal to a thickness of a peripheral of the second organic thin film. In this case, when forming the second organic thin film 4 by using the liquid material, the liquid material may not flow beyond the region defined by the barrier structure 5 so that the subsequent separation process may be successfully performed.

It is noted that, the barrier structure 5 may be made of various materials. Optionally, the barrier structure 5 may be made of an organic material such as organic photosensitive resin. The organic photosensitive resin may be separated from the base substrate 1 in case of being irradiated by a lower-energy laser beam. Therefore, in a case that the organic material such as the organic photosensitive resin is used to form the barrier structure 5, the subsequent separation process may not be significantly adversely affected even if the orthographic projection of the barrier structure 5 onto the first organic thin film 2 is located at an outer side of the periphery of the first organic thin film 2. Hence, in some embodiments of the present disclosure, the barrier structure 5 may be located on the periphery of the first organic thin film 2 or at the outer side of the periphery of the first organic thin film 2.

The present disclosure further provides in some embodiments a flexible display substrate including the above-mentioned flexible substrate and display components arranged on the flexible substrate. Because the barrier structure 5 in the above flexible substrate may restrict the orthographic projection of the second organic thin film 4 onto the first organic thin film 2 to be within the coverage range of the first organic thin film 2, the second organic thin film 4 may not affect the separation process adversely when performing the separation process after the display component is formed on the second organic thin film 4. Therefore, the subsequent separation process may be performed successfully and the yield of the product is ensured.

It is noted that, the display component formed on the second organic thin film 4 may include a thin film transistor (TFT) array layer, a light-emitting element and a thin film encapsulation layer. In addition, the flexible display substrate provided in the present disclosure may be an organic light-emitting diode (OLED) display substrate or a quantum-dot light-emitting diode (QLED) display substrate.

Figure 5:
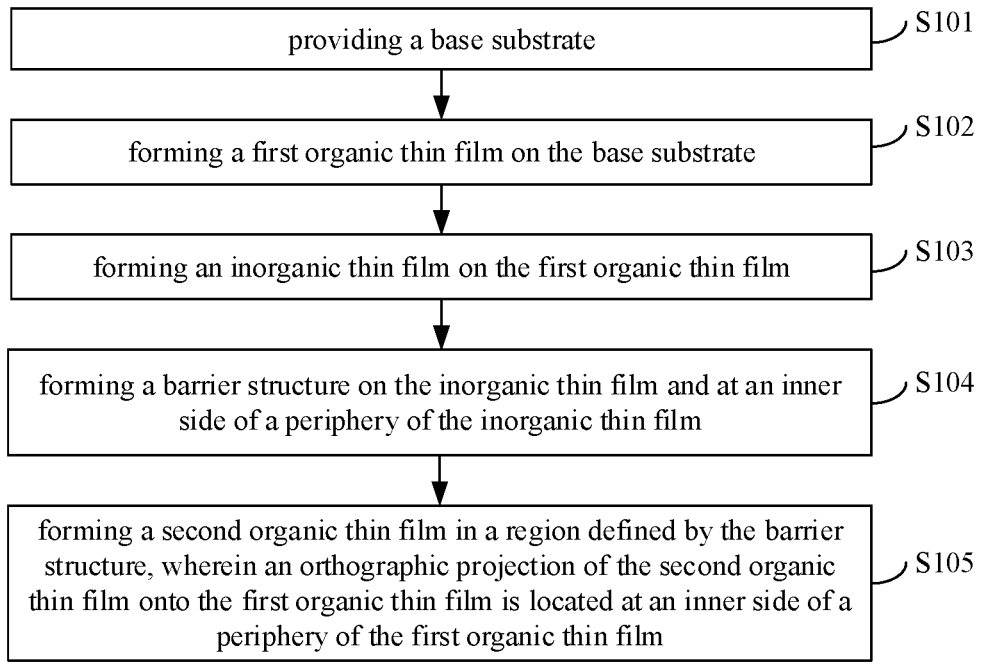
FIG. 5 is a flowchart of a method for manufacturing a flexible substrate provided in the present disclosure.

The present disclosure further provides in some embodiments a method for manufacturing the flexible substrate. As shown in FIG. 5, the method for manufacturing the flexible substrate includes the following Steps S101 to S105.

Step S101: providing the base substrate 1.

To be specific, the base substrate 1 may be, but not limited to, a glass substrate.

Step S102: forming the first organic thin film 2 on the base substrate 1.

To be specific, the first organic thin film 2 may be formed on the base substrate 1 by using an organic material (e.g., polyimide). The first organic thin film 2 may have a thickness between 5 μm to 30 μm.

Step S103: forming the inorganic thin film 3 on the first organic thin film 2.

To be specific, the inorganic thin film 3 capable of blocking moisture and oxygen may be formed on the first organic thin film 2 by using silicon nitride (SiN) or silicon oxide (SiO). The first organic thin film 2 is located at an inner side of a periphery of the inorganic thin film 3, i.e., a coverage region of the first organic thin film 2 is located within a coverage region of the inorganic thin film 3.

Step S104: forming the barrier structure 5 on the inorganic thin film 3 and at the inner side of the periphery of the inorganic thin film 3.

To be specific, the barrier structure 5 may be formed on the inorganic thin film 3 and at the inner side of the periphery of the inorganic thin film 3 by using an organic material (e.g., organic photosensitive resin) and the barrier structure 5 may define a region on the inorganic thin film 3. Optionally, the barrier structure 5 may also be formed on a periphery of the first organic thin film 2 or at an outer side of the periphery of the first organic thin film 2 by using the organic material (e.g., organic photosensitive resin), as long as the region defined by the barrier structure 5 is located at an inner side of the periphery of the first organic thin film 2.

Step S105: forming the second organic thin film 4 in the region defined by the barrier structure 5, wherein the orthographic projection of the second organic thin film 4 onto the first organic thin film 2 is located at the inner side of the periphery of the first organic thin film 2.

To be specific, the second organic thin film 4 having an area smaller than that of the first organic thin film 2 may be formed in the region defined by the barrier structure 5 by using an organic material (e.g., polyimide). The orthographic projection of the second organic thin film 4 onto the first organic thin film 2 is located at the inner side of the periphery of the first organic thin film 2.

According to the method in some embodiments of the present disclosure, the barrier structure 5 is formed on the inorganic thin film 3 and at the inner side of the periphery of the inorganic thin film 3 in such a manner that the barrier structure 5 may define a region on the inorganic thin film 3, and the second organic thin film 4 is formed in the region defined by the barrier structure 5, so that the orthographic projection of the second organic thin film 4 onto the first organic thin film 2 is located at the inner side of the periphery of the first organic thin film 2. Thus, when performing the separation process using the LLO technique, only the region in which the first organic thin film 2 is located needs to be scanned by using the LLO technique to separate the first organic thin film 2 from the base substrate 1, and the second organic thin film 4 is automatically separated from the base substrate 1. In this way, the above separation problem is solved and the yield of the product and the process stability are ensured.

Figure 6:
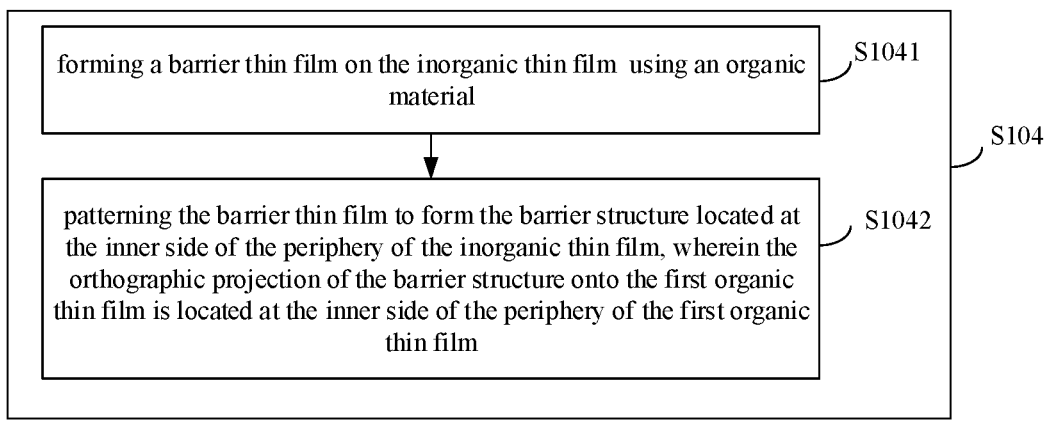
FIG. 6 is a detailed flowchart of a step in the method for manufacturing a flexible substrate provided in the present disclosure.

Referring to FIG. 6, the Step S104 of forming the barrier structure 5 on the inorganic thin film 3 and at the inner side of the periphery of the inorganic thin film 3 may include the following Sub-steps S1041 and S1042.

Sub-step S1041: forming a barrier thin film on the inorganic thin film 3 using an organic material.

To be specific, the barrier thin film may be formed on the inorganic thin film 3 by using the organic material and through a coating process.

Sub-step S1042: patterning the barrier thin film to form the barrier structure 5 located at the inner side of the periphery of the inorganic thin film 3, wherein the orthographic projection of the barrier structure 5 onto the first organic thin film 2 is located at the inner side of the periphery of the first organic thin film 2.

To be specific, the barrier thin film may be exposed by using a mask plate, and the exposed barrier thin film may be developed to form the barrier structure 5 at the periphery of the inorganic thin film 3. A specific position of the barrier structure 5 may be defined in such a manner that the orthographic projection of the barrier structure 5 onto the first organic thin film 2 is located at the inner side of the periphery of the first organic thin film 2. Optionally, the orthographic projection of the barrier structure 5 onto the first organic thin film 2 is located on the periphery of the first organic thin film or at the outer side of the periphery of the first organic thin film.

Step S105 of forming the second organic thin film 4 in the region defined by the barrier structure 5 may include: in the region defined by the barrier structure 5, forming the second organic thin film 4 having a thickness at the periphery of the second organic thin film 4 smaller than or equal to the thickness of the barrier structure 5.

More specifically, in a case that the second organic thin film 4 is formed in the region defined by the barrier structure 5 by using an organic liquid material, the periphery of the second organic thin film 4 may be formed to have a thickness smaller than or equal to that of the barrier structure 5, so as to prevent the organic liquid material from flowing beyond the region defined by the barrier structure 5 and thereby to prevent the second organic thin film 4 from extending beyond the periphery of the first organic thin film 2.

Figure 7:
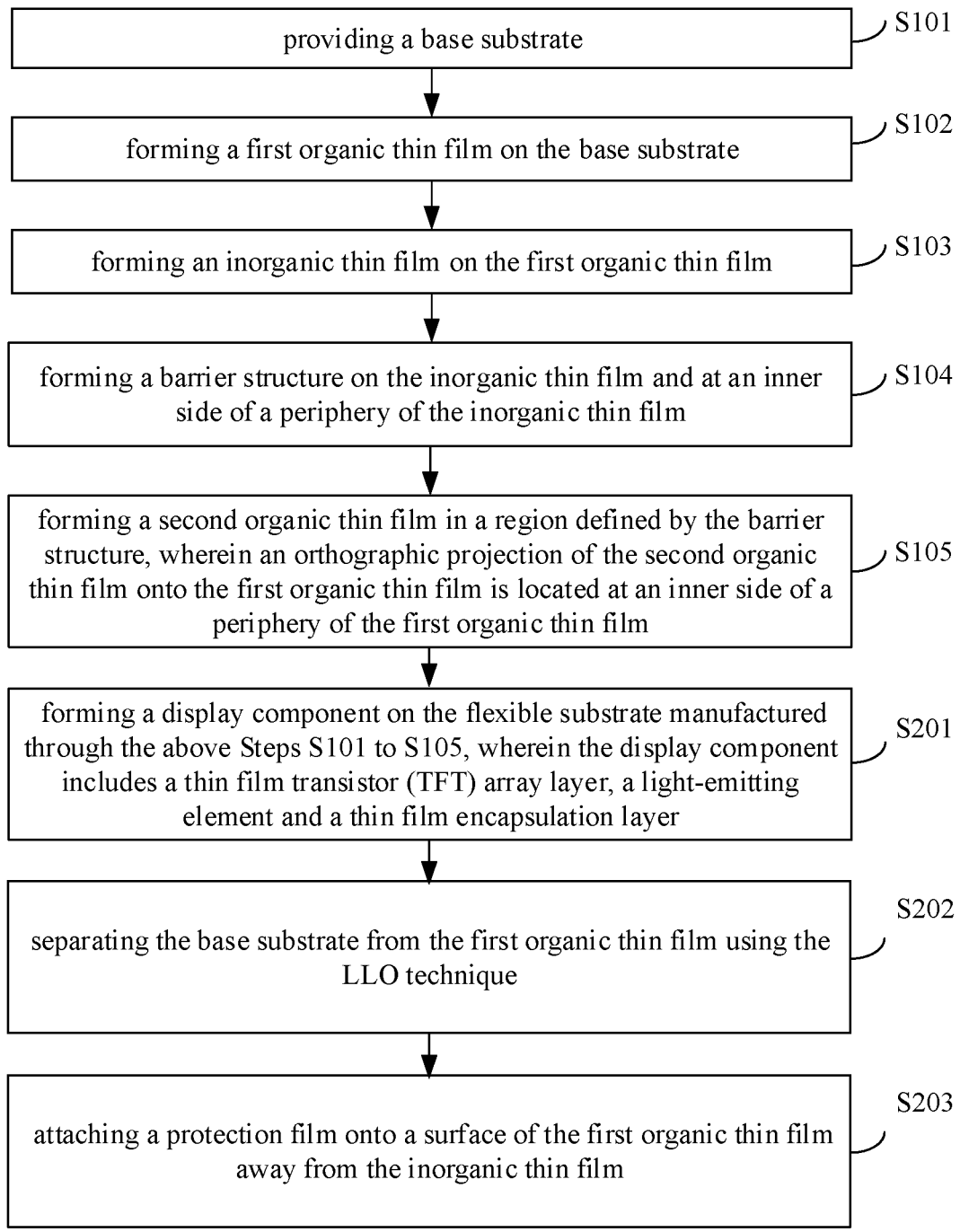
FIG. 7 is a flowchart of a method for manufacturing a flexible display substrate provided in the present disclosure.

The present disclosure further provides in some embodiments a method for manufacturing the flexible display substrate, and the method includes steps of the above method for forming the flexible substrate. In addition, as shown in FIG. 7, the method for manufacturing the flexible display substrate further includes the following Steps S201 to S203.

Step S201: forming a display component on the flexible substrate manufactured through the above Steps S101 to S105, wherein the display component includes a thin film transistor (TFT) array layer, a light-emitting element and a thin film encapsulation layer.

Step S202: separating the base substrate 1 from the first organic thin film 2 using the LLO technique.

To be specific, the orthographic projection of the second organic thin film 4 onto the first organic thin film 2 is located at the inner side of the periphery of the first organic thin film 2. Therefore, when scanning the flexible display substrate having the display component formed thereon using a laser beam, only a region in which the first organic thin film 2 is located is needed to be scanned with the laser beam to separate the first organic thin film 2 from the base substrate 1, and the second organic thin film 4 may automatically be separated from the base substrate 1 while separating the first organic thin film 2 from the base substrate 1. Thereby, the above separation problem is solved and the yield of the product and a stability of the process are ensured.

Step S203: attaching a protection film onto a surface of the first organic thin film 2 away from the inorganic thin film 3.

To be specific, after the separation process is completed, the protection film may be attached onto the first organic thin film 2, so as to finish a manufacturing process of the flexible display substrate.

According to the manufacturing method of the flexible display substrate in the embodiments of the present disclosure, the barrier structure 5 is formed at the inner side of the periphery of the inorganic thin film 3 and the barrier structure 5 may define the region on the inorganic thin film 3, and the second organic thin film 4 is formed in the region defined by the barrier structure 5 in such a manner that the orthographic projection of the second organic thin film 4 onto the first organic thin film 2 is located at the inner side of the periphery of the first organic thin film 2. Thus, when performing the subsequent separation process by using the LLO technique, only a region in which the first organic thin film 2 is located is needed to be scanned with the laser beam to separate the first organic thin film 2 from the base substrate 1, and the second organic thin film 4 may automatically be separated from the base substrate 1 while separating the first organic thin film 2 from the base substrate 1. Thereby, the above separation problem is solved and the yield of the product and a stability of the process are ensured.

In order to explain the manufacturing method of the flexible display substrate of the present disclosure more clearly, a specific example of manufacturing the flexible display substrate is provided hereinafter, and includes the following steps.

A glass substrate may be provided, and a first organic material may be coated onto the glass substrate. Then, the first organic material is cured to form the first organic thin film 2 having a thickness in a range of 5 μm to 30 μm. Next, the inorganic thin film 3 capable of blocking moisture and oxygen may be formed on the first organic thin film 2 by using SiN or SiO. Next, the barrier thin film may be formed on the inorganic thin film 3 by using an organic photosensitive resin material. Next, the barrier thin film may be patterned, so as to form the barrier structure 5 located at an inner side of the periphery of the inorganic thin film 3. The orthographic projection of the barrier structure 5 onto the first organic thin film 2 is of a square ring shape, and the barrier structure 5 may define a region in the middle of the inorganic thin film 3. In addition, the orthographic projection of the barrier structure 5 onto the first organic thin film 2 is located at the inner side of the periphery of the first organic thin film 2. Next, the second organic thin film 4 is formed in the region defined by the barrier structure 5 by using an organic liquid material, wherein the thickness of the peripheral of the second organic thin film 4 is smaller than or equal to the thickness of the barrier structure 5, and the orthographic projection of the second organic thin film 4 onto the first organic thin film 2 is located at the inner side of the periphery of the first organic thin film 2. Next, an inorganic layer, a planarization layer, the TFT array layer, the light-emitting layer and the thin film encapsulation layer may be formed sequentially on the second organic thin film 4, wherein the thin film encapsulation layer is of a stacked structure formed by inorganic layers and organic layers arranged alternately. Next, the glass substrate may be separated from the first organic thin film 2 by using the LLO technique. Then, the protection film may be attached onto the first organic thin film 2, so as to finish the manufacturing process of the flexible display substrate.

According to the embodiments of the present disclosure, the barrier structure is formed on the inorganic thin film and at the inner side of the periphery of the inorganic thin film so that the barrier structure may define a region on the inorganic thin film, and the second organic thin film formed in the region defined by the barrier structure does not extend beyond the periphery of the first organic thin film, i.e., the orthographic projection of the second organic thin film onto the first organic thin film is located at the inner side of the periphery of the first organic thin film. Thus, when performing the subsequent separation process by using the LLO technique, the first organic thin film may be separated from the base substrate 1 by using a laser beam having a determined amount of energy, and the second organic thin film may automatically be separated from the base substrate while separating the first organic thin film from the base substrate. Thereby, the above separation problem is solved and the yield of the product and a stability of the process are ensured.

Unless otherwise defined, any technical or scientific term used herein should have a common meaning understood by a person of ordinary skills. Such words as "first" and "second" used in the specification and claims are merely used to differentiate different components rather than to represent any order, number or importance. Such words as "include", "including", "comprising", "comprise" or the like mean that an element or an article preceding the words contains another element or article or the like behind the words, but does not preclude containing other elements or articles. Such words as "connecting", "connect" or "connected to" may include electrical connection, direct or indirect, rather than to be limited to physical or mechanical connection. Such words as "above", "under", "left" and "right" are merely used to represent relative position relationship, and when an absolute position of a described object is changed, the relative position relationship may also be changed accordingly.

The above are merely the optional embodiments of the present disclosure, but the present disclosure is not limited thereto. Obviously, a person skilled in the art may make further modifications and improvements without departing from the spirit of the present disclosure, and these modifications and improvements shall also fall within the scope of the present disclosure. Therefore, the scope of the present disclosure is determined by the scope of the claims.

What is claimed is:

1. A flexible substrate for supporting a display component, comprising:
    a first organic thin film;
    a first inorganic thin film on the first organic thin film;
    a barrier structure on the first inorganic thin film and adjacent to an outermost periphery of the first inorganic thin film, and
    a second organic thin film in a region defined by the barrier structure, wherein an orthographic projection of the second organic thin film onto the first organic thin film is at an inner side of an outermost periphery of the first organic thin film, and is not covered by an orthographic projection of the barrier structure onto the first organic thin film,
    wherein the display component is supported on the second organic thin film,
    the first organic thin film, the first inorganic thin film, the second organic thin film are separable from a base substrate below the first organic thin film,
    the outermost periphery of the first organic thin film is at an inner side of the outermost periphery of the first inorganic thin film, and is spaced from the outermost periphery of the first inorganic thin film,
    an entirety of a surface of the first organic thin film facing towards the first inorganic thin film directly contacts with a first surface of the first inorganic thin film,
    an entirety of a surface of the second organic thin film facing towards the first inorganic thin film directly contacts a second surface opposite to the first surface of the first inorganic thin film.

2. The flexible substrate according to claim 1, wherein the orthographic projection of the barrier structure onto the first organic thin film is at the inner side of the outermost periphery of the first organic thin film, and is spaced from the outermost periphery of the first organic thin film.

3. The flexible substrate according to claim 1, wherein the orthographic projection of the barrier structure onto the first organic thin film covers the outermost periphery of the first organic thin film, or is at an outer side of the outermost periphery of the first organic thin film.

4. The flexible substrate according to claim 1, wherein each of the first organic thin film and the second organic thin film is a flexible thin film, and the base substrate is a glass substrate.

5. The flexible substrate according to claim 1, wherein a portion of the first inorganic thin film between the outermost periphery of the first organic thin film and the outermost periphery of the first inorganic thin film directly contacts the base substrate.

6. The flexible substrate according to claim 1, further comprising:
    a second inorganic layer and a planarization layer formed sequentially on the second organic thin film.

7. The flexible substrate according to claim 6, wherein a thin film encapsulation layer is a structure formed by inorganic layers and organic layers stacked alternately above the planarization layer.

8. A flexible display substrate, comprising:
    the flexible substrate according to claim 6, and
    the display component directly on the flexible substrate.

9. The flexible display substrate according to claim 8, wherein the display component comprises a thin film transistor (TFT) array layer, a light-emitting element and a thin film encapsulation layer, wherein the thin film transistor (TFT) array layer, the light-emitting element and the thin film encapsulation layer are sequentially formed on the planarization layer.

10. The flexible display substrate according to claim 9, further comprising:
    a protection film at a surface of the first organic thin film away from the first inorganic thin film.

11. The flexible substrate according to claim 1, wherein the outermost periphery of the first organic thin film is covered by the first inorganic thin film.

12. The flexible substrate according to claim 1, wherein, a cross section of the barrier structure is a hemispherical shape.

13. The flexible substrate according to claim 1, wherein the surface of the first organic thin film facing towards the first inorganic thin film has a first portion of a non-planar shape, the first portion is adjacent to the barrier structure.

14. A method for manufacturing a flexible substrate used for supporting a display component, wherein the flexible substrate comprises a first organic thin film; a first inorganic thin film on the first organic thin film; a barrier structure on the first inorganic thin film and adjacent to an outermost periphery of the first inorganic thin film, and a second organic thin film in a region defined by the barrier structure, wherein an orthographic projection of the second organic thin film onto the first organic thin film is at an inner side of an outermost periphery of the first organic thin film, and is not covered by an orthographic projection of the barrier structure onto the first organic thin film, wherein the display component is supported on the second organic thin film, the first organic thin film, the first inorganic thin film, the second organic thin film are separable from a base substrate below the first organic thin film, the outermost periphery of the first organic thin film is at an inner side of the outermost periphery of the first inorganic thin film, and is spaced from the outermost periphery of the first inorganic thin film, an entirety of a surface of the first organic thin film facing towards the first inorganic thin film directly contacts with a first surface of the first inorganic thin film, an entirety of a surface of the second organic thin film facing towards the first inorganic thin film directly contacts a second surface opposite to the first surface of the first inorganic thin film, the method comprises:

provide the base substrate;

forming the first organic thin film on the base substrate;

forming the first inorganic thin film on the first organic thin film;

forming the barrier structure on the first inorganic thin film and at the inner side of the outermost periphery of the first inorganic thin film; and forming the second organic thin film in a region defined by the barrier structure.

15. The method according to claim 14, wherein the forming the barrier structure on the first inorganic thin film and at the inner side of the outermost periphery of the first inorganic thin film comprises:

forming a barrier thin film on the first inorganic thin film using an organic material; and patterning the barrier thin film to form the barrier structure located at the inner side of the outermost periphery of the first inorganic thin film, wherein the orthographic projection of the barrier structure onto the first organic thin film is at the inner side of the outermost periphery of the first organic thin film, and is spaced from the outermost periphery of the first organic thin film.

16. The method according to claim 14, wherein the forming the second organic thin film in the region defined by the barrier structure comprises:

in the region defined by the barrier structure, forming the second organic thin film having a thickness at the outermost periphery of the second organic thin film smaller than or equal to a thickness of the barrier structure.

17. The method according to claim 14, wherein the forming the barrier structure on the first inorganic thin film and at the inner side of the periphery of the first inorganic thin film comprises:

forming a barrier thin film on the first inorganic thin film using an organic material; and patterning the barrier thin film to form the barrier structure located at the inner side of the outermost periphery of the first inorganic thin film, wherein the orthographic projection of the barrier structure onto the first organic thin film covers the outermost periphery of the first organic thin film, or is at an outer side of the outermost periphery of the first organic thin film.

18. The method according to claim 14, wherein the outermost periphery of the first organic thin film is covered by the first inorganic thin film.

19. A method for manufacturing a flexible display substrate, comprising:

forming the flexible substrate using the method according to claim 14;

forming the display component directly on the flexible substrate, the display component comprising a thin film transistor (TFT) array layer, a light-emitting element and a thin film encapsulation layer;

separating the base substrate from the first organic thin film using a laser lift-off technique; and attaching a protection film onto a surface of the first organic thin film away from the first inorganic thin film.

* * * * *